US012061100B2

(12) United States Patent
Ekhaml et al.

(10) Patent No.: US 12,061,100 B2
(45) Date of Patent: Aug. 13, 2024

(54) VARIABLE RELUCTANCE RESOLVER USING SURFACE MOUNTED INDUCTORS AND/OR TRANSFORMERS

(71) Applicant: Moog Inc., East Aurora, NY (US)

(72) Inventors: William J. Ekhaml, Blacksburg, VA (US); Heath E. Kouns, Christiansburg, VA (US)

(73) Assignee: Moog Inc., East Aurora, NY (US)

( * ) Notice: Subject to any disclaimer, the term of this patent is extended or adjusted under 35 U.S.C. 154(b) by 145 days.

(21) Appl. No.: 17/913,684

(22) PCT Filed: Mar. 23, 2021

(86) PCT No.: PCT/US2021/023738
§ 371 (c)(1),
(2) Date: Sep. 22, 2022

(87) PCT Pub. No.: WO2021/195118
PCT Pub. Date: Sep. 30, 2021

(65) Prior Publication Data
US 2023/0110644 A1     Apr. 13, 2023

Related U.S. Application Data

(60) Provisional application No. 62/993,513, filed on Mar. 23, 2020.

(51) Int. Cl.
*G01D 5/20* (2006.01)
*G01P 3/488* (2006.01)
(Continued)

(52) U.S. Cl.
CPC ............ *G01D 5/2046* (2013.01); *G01P 3/488* (2013.01); *H02K 24/00* (2013.01); *H05K 1/181* (2013.01); *H02K 2211/03* (2013.01)

(58) Field of Classification Search
CPC .. G01D 5/2046; G01D 2205/77; G01P 3/488; H02K 24/00; H02K 2211/03; H05K 1/181
See application file for complete search history.

(56) References Cited

U.S. PATENT DOCUMENTS 5,191,284 A * 3/1993 Moretti ................. F16C 33/78
324/207.2
6,534,970 B1   3/2003 Ely et al.
(Continued)

FOREIGN PATENT DOCUMENTS

CN       108562309 A     9/2018
FR       2790313 A1      9/2000
(Continued)

OTHER PUBLICATIONS

Q. Tang, D. Peng, L. Wu and X. Chen, "An Inductive Angular Displacement Sensor Based on Planar Coil and Contrate Rotor," in IEEE Sensors Journal, vol. 15, No. 7, pp. 3947-3954, Jul. 2015 (Year: 2015).*

(Continued)

*Primary Examiner* — Daniel R Miller
(74) *Attorney, Agent, or Firm* — Harter Secrest & Emery LLP (57) ABSTRACT

A variable reluctance resolver with a stator assembly including a printed circuit board having a first surface and a second surface. A plurality of inductors coupled with the annular printed circuit board first surface, wherein the plurality of inductors are in electrical connection with a power source. The variable reluctance resolver also having a rotor including a body with a first surface and a second surface, an annular recess located in the rotor first surface. The annular recess including a radially inner surface and a radially outer surface, wherein the annular recess defines a width variable with angular position. The plurality of inductors are located (Continued)

at least partially within the annular recess and the rotor is operable to rotate relative to the stator assembly.

15 Claims, 9 Drawing Sheets

(51) Int. Cl.
*H02K 24/00* (2006.01)
*H05K 1/18* (2006.01)

(56) References Cited

U.S. PATENT DOCUMENTS

| | | | |
|---|---|---|---|
| 7,088,025 | B2 | 8/2006 | Kujirai et al. |
| 8,310,228 | B2 | 11/2012 | Miyazaki et al. |
| 8,674,687 | B2 | 3/2014 | Kikuchi et al. |
| 8,928,310 | B2 | 1/2015 | Ocket et al. |
| 9,013,179 | B2 | 4/2015 | Sakamoto et al. |
| 9,270,148 | B2 | 2/2016 | Van Nimmen et al. |
| 9,810,550 | B2 | 11/2017 | Goto et al. |
| 10,012,267 | B2 * | 7/2018 | Kegeler ................. H05K 1/165 |
| 2010/0156401 | A1 | 6/2010 | Nishiguchi et al. |
| 2011/0285386 | A1 | 11/2011 | Kikuchi et al. |
| 2013/0285513 | A1 | 10/2013 | Tani et al. |
| 2013/0307366 | A1 | 11/2013 | Naginsky et al. |
| 2014/0217859 | A1 | 8/2014 | Hitachi et al. |
| 2017/0152894 | A1 | 6/2017 | Kegeler |
| 2018/0115202 | A1 | 4/2018 | Hirotani et al. |
| 2018/0356254 | A1 | 12/2018 | Kegeler |

FOREIGN PATENT DOCUMENTS

| | | |
|---|---|---|
| JP | 4446056 B2 | 4/2010 |
| JP | 5182752 B2 | 4/2013 |
| WO | 2014095880 A2 | 6/2014 |

OTHER PUBLICATIONS

B. P. Reddy, A. Murali and G. Shaga, "Low cost planar coil structure for inductive sensors to measure absolute angular position," 2017 2nd International Conference on Frontiers of Sensors Technologies (ICFST), Shenzhen, China, 2017, pp. 14-18 (Year: 2017).*

Aung (2015) "Analysis and Synthesis of Precision Resolver System," Doctoral Thesis, National University of Singapore:1-187.

Oshino et al. (2017) "Thin resolver using the easy magnetization axis of the grain-oriented silicon steel as an angle indicator," AIP Advances 7, 056662, 1-8.

Reddy et al. (2017) "Low Cost Planar Coil Structure for Inductive Sensors to Measure Absolute Angular Position," IEEE, 2nd International Conference on Frontiers of Sensors Technologies: pp. 14-18.

* cited by examiner

VARIABLE RELUCTANCE RESOLVER USING SURFACE MOUNTED INDUCTORS AND/OR TRANSFORMERS

TECHNICAL FIELD

The present disclosure relates generally to a variable reluctance resolver and the method of making same.

BACKGROUND

Figure 1:
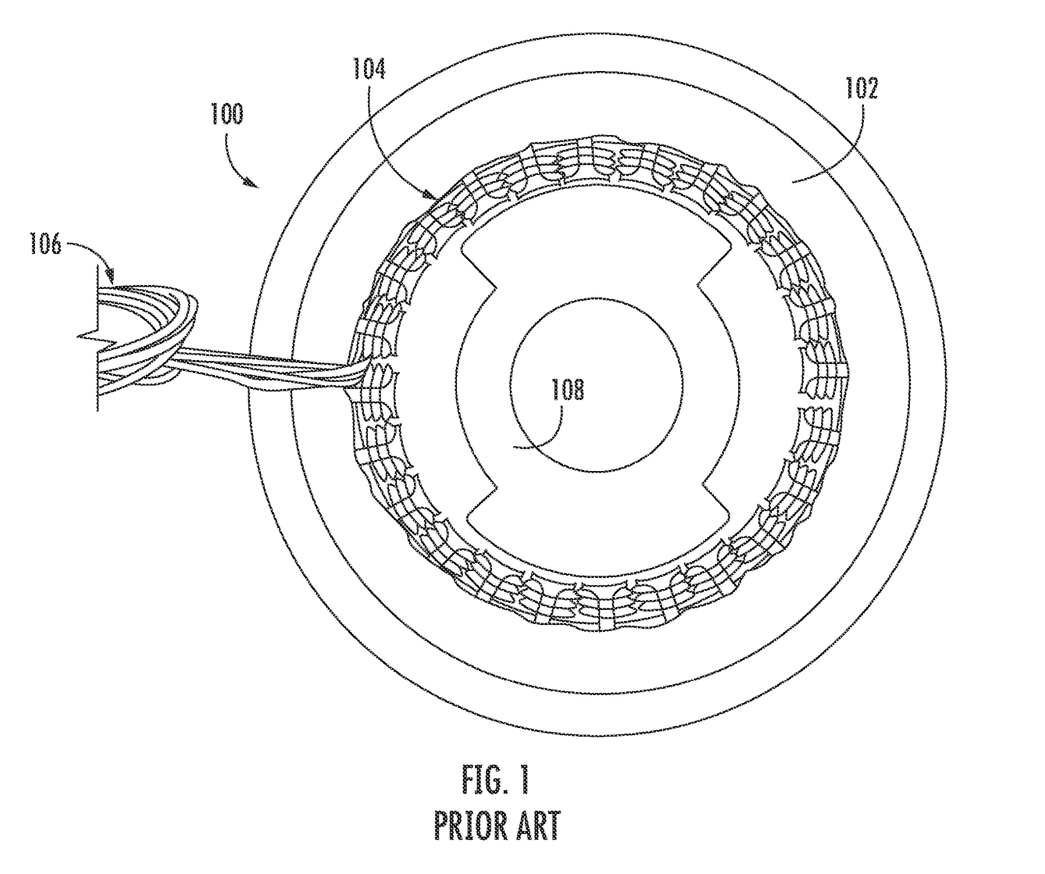
FIG. 1 shows a top plan view of a schematic of a conventional resolver.

A resolver is an electromagnetic transducer operable to convert angular position into an electrical variable. Angular position sensors are based on the principle of a variable magnetic flux intensity in the air gap between a stator and a rotor. Conventional resolvers utilize differing methods for generating a magnetomotive force in the transmitting part and measuring the magnetic field in the receiving part. For example, a conventional resolver may include electromagnetic coils in the form of primary and secondary windings. As illustrated in FIG. 1, a conventional resolver 100 includes a stator 102 of iron-alloy laminations and a rotor 108 of iron-alloy laminations. The stator 102 defines slots into which very fine wire windings 104 are installed. The rotor 108 includes two lobes operable to influence the magnetic flux in the windings 104, whereby the angular position of the rotor 108 may be derived. The windings 104 are hand-soldered to heavier lead wires 106. The hand-soldering operation stresses the windings 104 to the point of near failure. This stress of the windings 104 can lead to early failure of the windings 104 or the solder joint connecting them to the lead wires 106. In addition, the manufacturing and handling processes required to install the windings 104 into the slots of the stator 102 can stress or damage the windings, resulting in early failure of the windings 104.

SUMMARY

The present disclosure provides for a variable reluctance resolver. In a first exemplary embodiment of the present disclosure, a variable reluctance resolver includes a stator assembly (202) having a printed circuit board (206) with a first surface and a second surface. A plurality of inductors (204) are coupled with the annular printed circuit board (206) first surface, wherein the plurality of inductors (204) are in electrical connection with a power source. The variable reluctance resolver also includes a rotor (230) having a body with a first surface and a second surface. An annular recess (234) is located in the rotor first surface, the annular recess (234) including a radially inner surface (236) and a radially outer surface (238), wherein the annular recess (234) defines a width ($w_1$, $w_2$) variable with an angular position. The plurality of inductors (204) are located at least partially within the annular recess (234) and the rotor (230) is operable to rotate relative to the stator assembly (202).

In a second exemplary embodiment of the present disclosure, a variable reluctance resolver includes a stator assembly (202) having a printed circuit board (206) with a first surface and a second surface. A plurality of transformers (204) are coupled with the annular printed circuit board (206) first surface, wherein the plurality of transformers (204) are in electrical connection with a power source. The variable reluctance resolver also includes a rotor (230) having a body with a first surface and a second surface. An annular recess (234) is located in the rotor first surface, the annular recess (234) including a radially inner surface (236) and a radially outer surface (238), wherein the annular recess (234) defines a width ($w_1$, $w_2$) variable with an angular position. The plurality of transformers (204) are located at least partially within the annular recess (234) and the rotor (230) is operable to rotate relative to the stator assembly (202).

In a third exemplary embodiment of the present disclosure, a method of manufacturing a variable reluctance resolver (200) includes providing a printed circuit board (206), a plurality of inductors (204), an automated machinery operable to electrically connect electronic components with the printed circuit board (206), and a rotor (230). The rotor (230) having a body with a first surface and a second surface, an annular recess (234) located in the rotor first surface, the annular recess (234) comprising a radially inner surface (236) and a radially outer surface (238), the annular recess (234) defining a width ($w_1$, $w_2$) variable with an angular position. The method also including placing one or more of the plurality of inductors (204) on the printed circuit board (206) via the automated machinery, soldering the one or more of the plurality of inductors (204) to the printed circuit board (206) via the automated machinery, and locating the printed circuit board (206) adjacent to the rotor (230), wherein the one or more of said plurality of inductors (204) soldered to the printed circuit board (206) are located at least partially within the annular recess (234).

BRIEF DESCRIPTION OF THE DRAWINGS

The accompanying drawings are incorporated herein as part of the specification. The drawings described herein illustrate embodiments of the presently disclosed subject matter and are illustrative of selected principles and teachings of the present disclosure. However, the drawings do not illustrate all possible implementations of the presently disclosed subject matter and are not intended to limit the scope of the present disclosure in any way.

DETAILED DESCRIPTION

It is to be understood that the invention may assume various alternative orientations and step sequences, except where expressly specified to the contrary. It is also to be understood that the specific assemblies and systems illustrated in the attached drawings and described in the following specification are simply exemplary embodiments of the inventive concepts defined herein. Hence, specific dimensions, directions, or other physical characteristics relating to the embodiments disclosed are not to be considered as limiting, unless expressly stated otherwise. Also, although they may not be, like elements in various embodiments described herein may be commonly referred to with like reference numerals within this section of the application.

Where they are used herein, the terms "first", "second", and so on, do not necessarily denote any ordinal, sequential, or priority relation, but are simply used to more clearly distinguish one element or set of elements from another, unless specified otherwise.

Figure 2A:
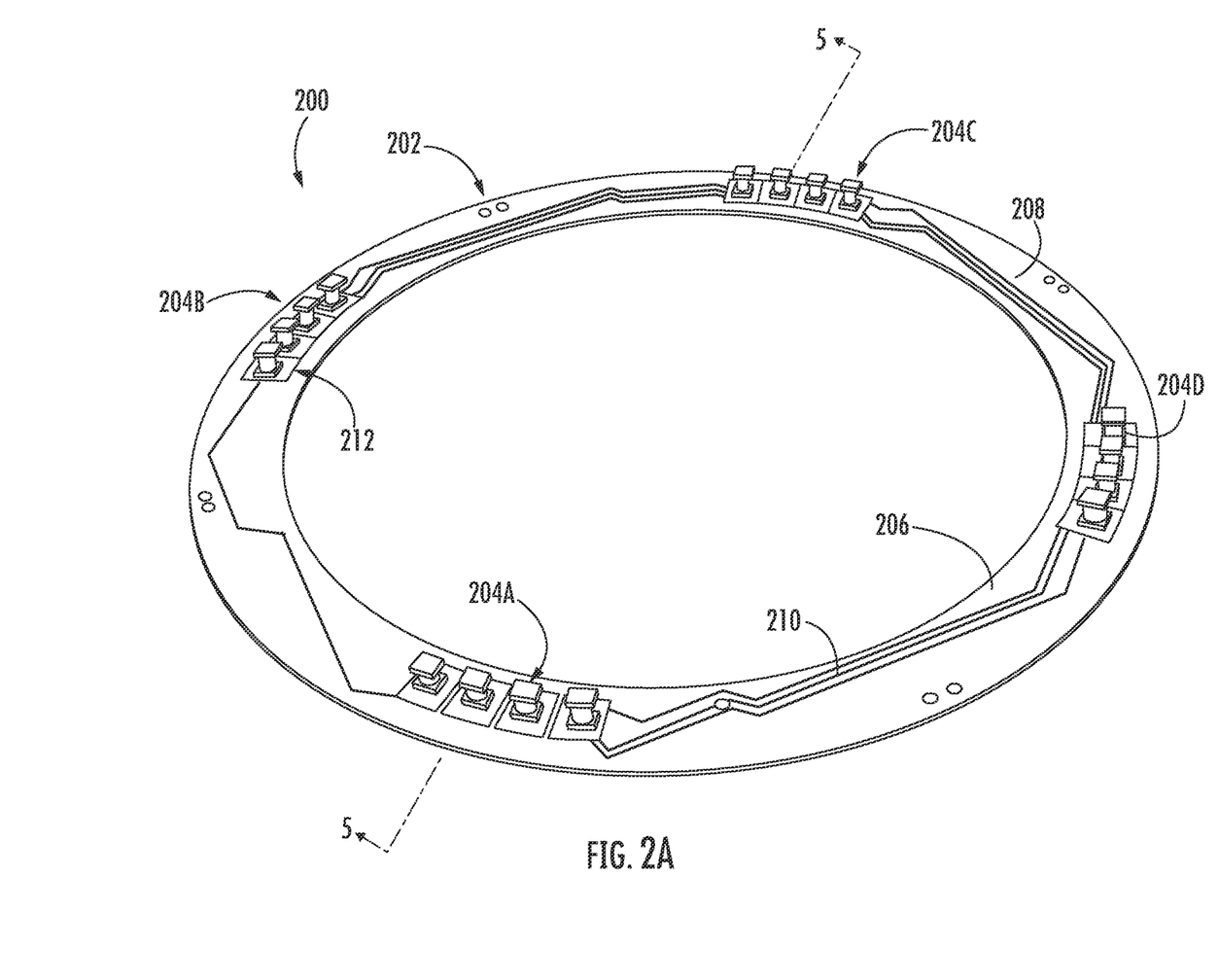
FIG. 2A shows a perspective view of a resolver stator assembly according to an embodiment of the present disclosure.
Figure 2B:
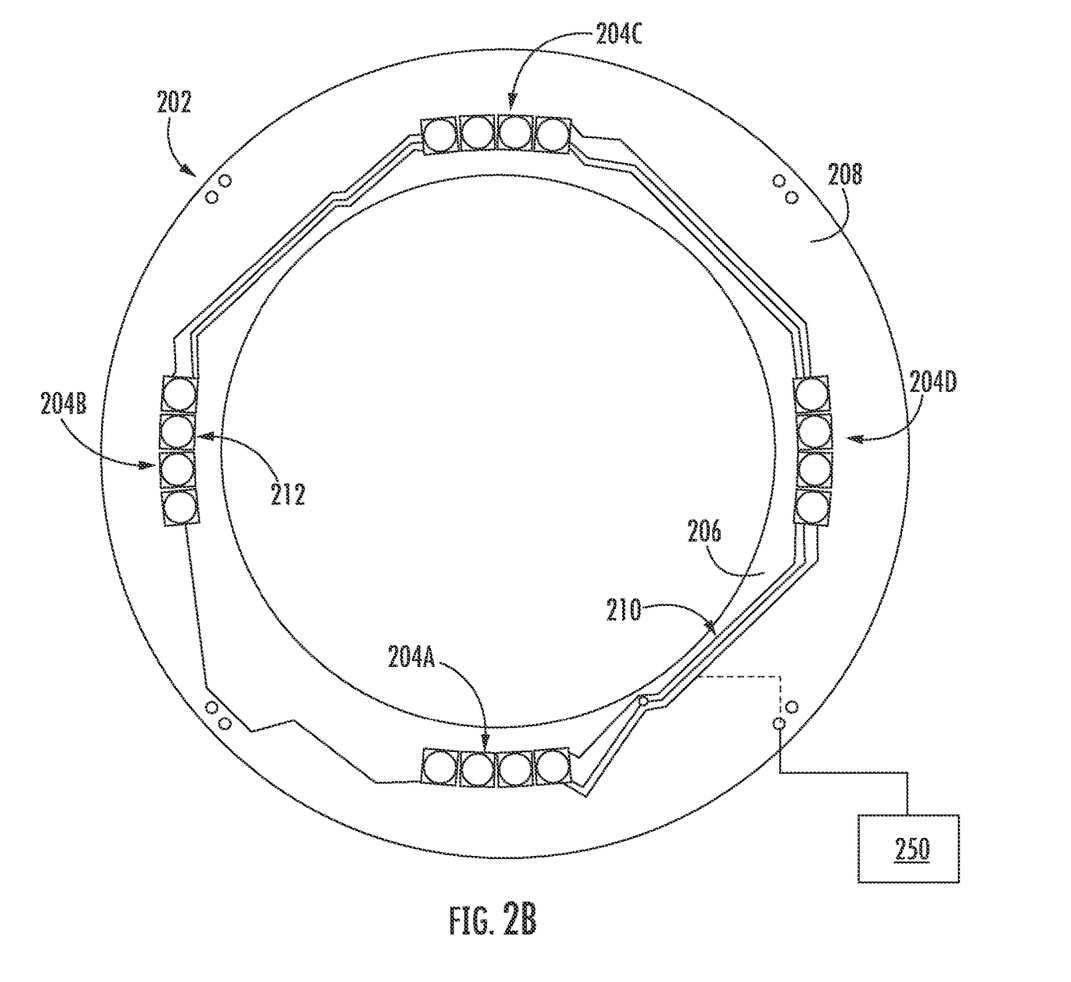
FIG. 2B shows a schematic top plan view of the stator assembly according to FIG. 2A.

As illustrated in FIGS. 2A and 2B, in an embodiment, a variable reluctance resolver 200 includes a stator assembly 202 comprising four groups of inductors 204A, 204B, 204C, 204D mounted to an annular printed circuit board (PCB) 206. The first group of inductors 204A provides the positive (+) cosine output signal, the second group of inductors 204B provides the positive (+) sine output signal, the third group of inductors 204C provides the negative (−) cosine output signal, and the fourth group of inductors 204D provides the negative (−) sine output signal. Each of the first, second, third, and fourth groups of inductors 204A, 204B, 204C, 204D may comprise four inductors 204. In other embodiments, more or fewer inductors per group of inductors 204A, 204B, 204C, 204D are contemplated to increase or decrease the magnitude of the output voltage. In an embodiment, the four groups of inductors 204A, 204B, 204C, 204D are located generally 90 degrees from each other about the PCB 206 on a first surface of the PCB 206.

The PCB 206 includes a substrate 208 comprising one or more dielectric layers. The PCB 206 also includes circuit traces 210 and connection pads 212 coupled with the substrate 208. The circuit traces 210 are separate lines operable to conduct electrical signals between connection pads 212 and components coupled with the PCB 206. In an embodiment, the inductors 204 are soldered to connection pads 212 of the PCB 206 via automated machinery, eliminating hand-soldering and a primary source of failure to increase reliability. The automated machinery may be pick-and-place machines also known as Surface Mount Technology (SMT) Component Placement Systems. Pick-and-place machines enable rapid and consistent PCB manufacturing.

Figure 3A:
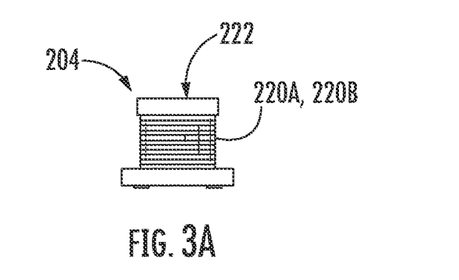
FIG. 3A shows a side plan view of an inductor according to an embodiment of the present disclosure.
Figure 3B:
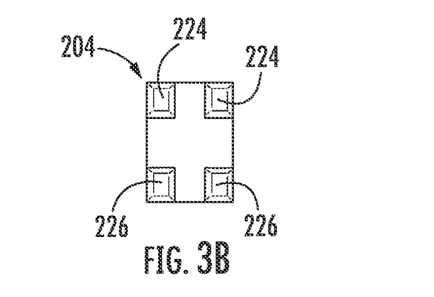
FIG. 3B shows a bottom plan view of an inductor according to FIG. 3A.
Figure 3C:
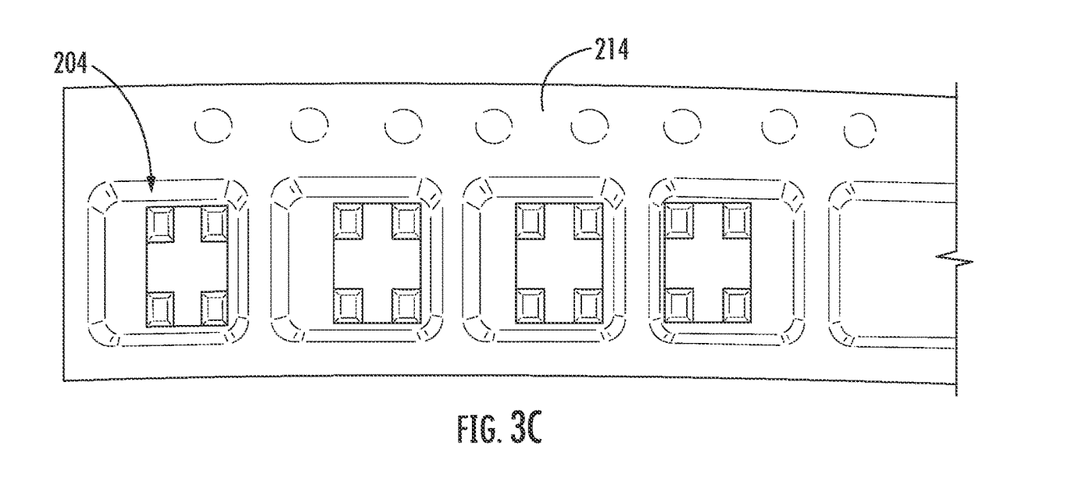
FIG. 3C shows a bottom plan view of a plurality of inductors according to FIG. 3A packaged for use in a pick-and-place machine.

As illustrated in FIGS. 3A, 3B, and 3C, in an embodiment, the inductors 204 are two coil inductors including an input coil 220A and an output coil 220B wrapped around a magnetic core 222. The input coil 220A and the output coil 220B are concentrically overlaid about the magnetic core 222. As illustrated in FIG. 3C, in an embodiment, each two coil inductor 204 includes solder pads 224 in electrical communication with the input coil 220A, and solder pads 226 in electrical communication with the output coil 220B. The magnetic core 222 comprises a ferromagnetic material such as, but not limited to, iron alloy or ferrite. In an embodiment, the inductors 204 are unshielded.

As illustrated in FIG. 2B, the circuit traces 210 on the PCB 206 provide connections from a voltage source 250 (i.e., power source) to the input coil 220A of each inductor 204. This voltage induces a current in the inductor input coil 220A, which in turn creates a magnetic flux though the magnetic core 222 of the inductor 204. The number of inductors 204 in the groups of inductors 204A, 204B, 204C, 204D may be changed/adjusted to vary the magnitude of the output voltage. The groups of inductors 204A, 204B, 204C, 204D may also be referred to as transformers herein.

Certain systems operable to utilize the variable reluctance resolver 200 require large air gaps between the stator and rotor. These large air gaps create an undesirable flux leakage. To mitigate the problem of undesirable flux leakage, created at least in part by a large air gap, the two coil inductor 204 locates both the input and output coil 220A, 220B on the same ferromagnetic core 222.

As illustrated in FIG. 3C, in an embodiment, the inductors 204 are provided, for installation by the pick-and-place machine, in/on reeled tape 214. In an embodiment, the inductors 204 are located in depressions/concavities in the tape 214 where they are operable to be selected by a pick-and-place machine and installed on a PCB.

Figure 4:
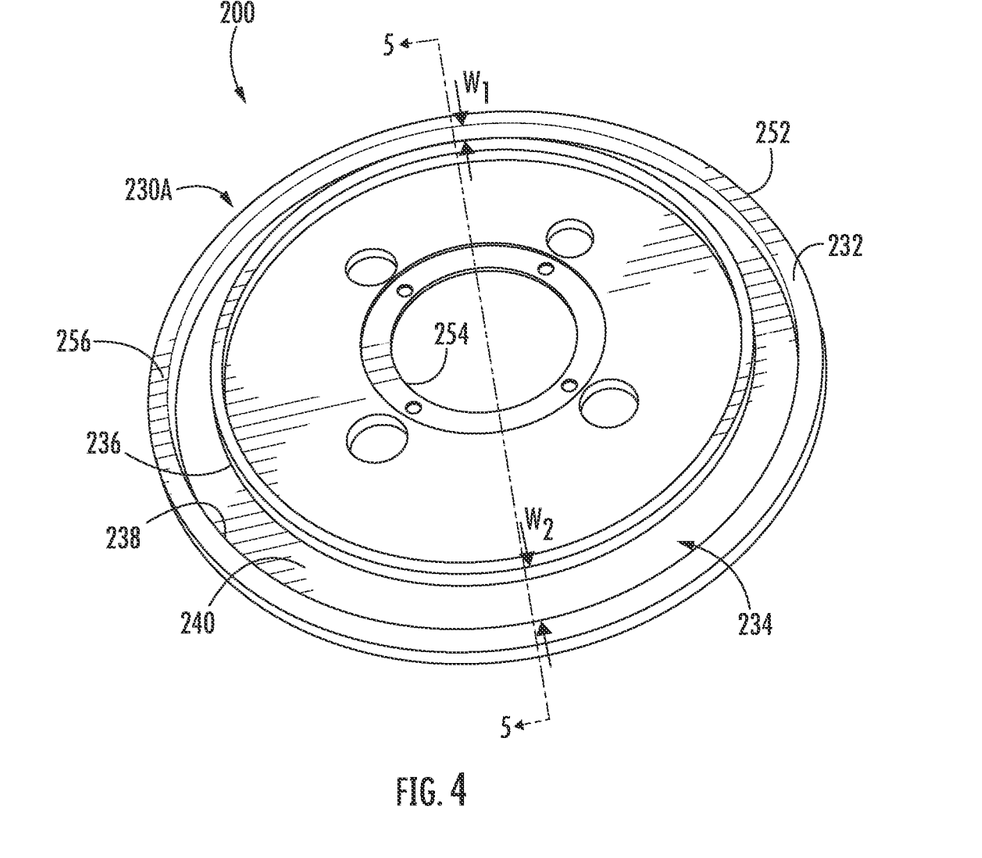
FIG. 4 shows a perspective view of a resolver rotor assembly according to an embodiment of the present disclosure.
Figure 5:
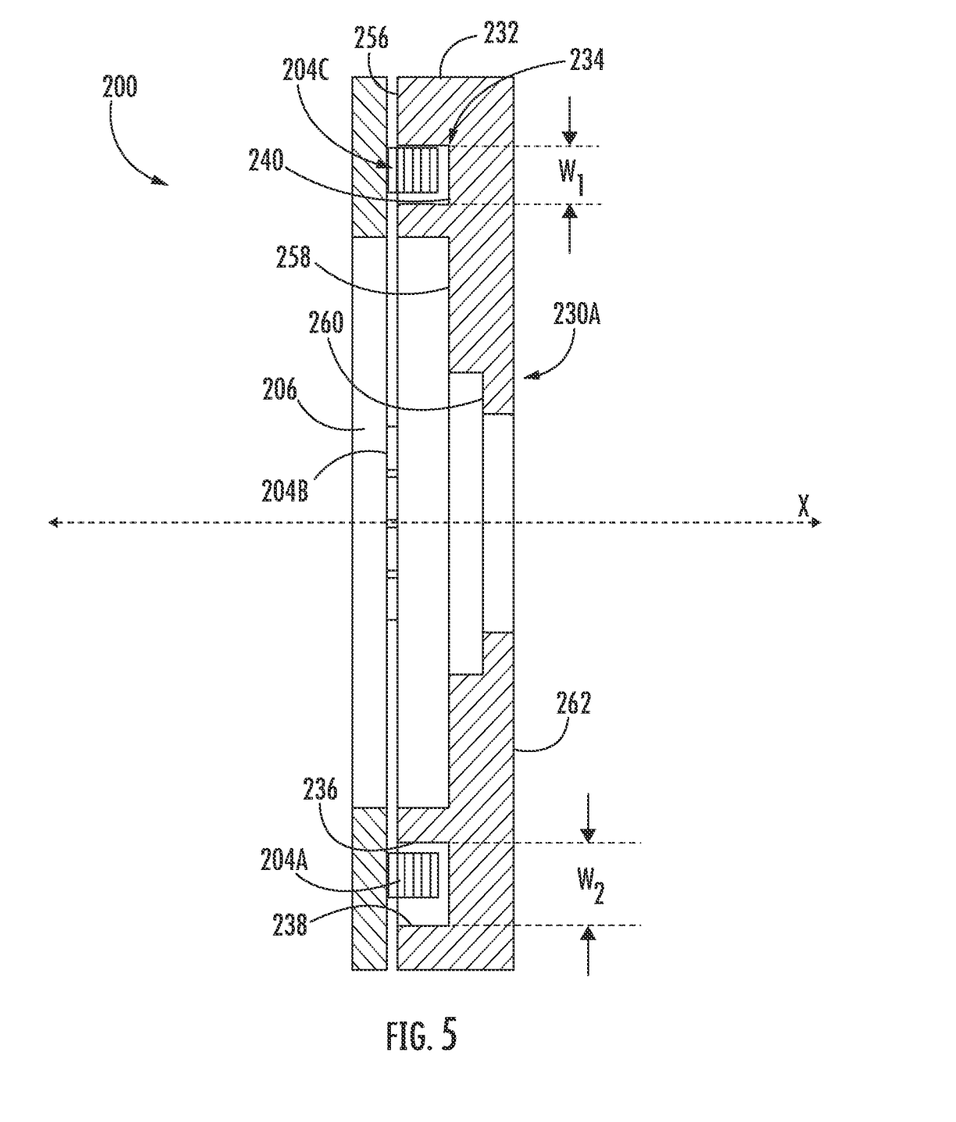
FIG. 5 shows a cross-sectional view of a schematic of the resolver assembly according to FIGS. 2A, 2B, and 4.

Referring now to FIGS. 4 and 5, the variable reluctance resolver 200 includes a rotor assembly 230A. In an embodiment, the rotor assembly 230A includes a body 232 having an annular recess 234. The annular recess 234 defines a radially-inner diametric surface 236, a radially-outer diametric surface 238, and a recess floor 240. In an embodiment, the surfaces 236, 238 are positioned generally orthogonal to the recess floor 240. In an embodiment, the annular recess 234 is a counter-bore machined into the body 232. The annular recess 234 comprises a width which varies with angular position about the circumference thereof. The annular recess 234 comprises a width $w_1$ at its most narrow, and a width $w_2$ at its most wide. In an embodiment, the rotor body 232 comprises a magnetic material such as 416-stainless steel. In an embodiment, the rotor body 232 defines a circular periphery 252 and includes a coaxial hole 254 located therethrough. The rotor body 232 may also include a first surface 256, a second surface 258 recessed from the first surface 256, a third surface 260 recessed from the second surface 258, and a fourth surface 262 located opposite the first surface 256.

Figure 6A:
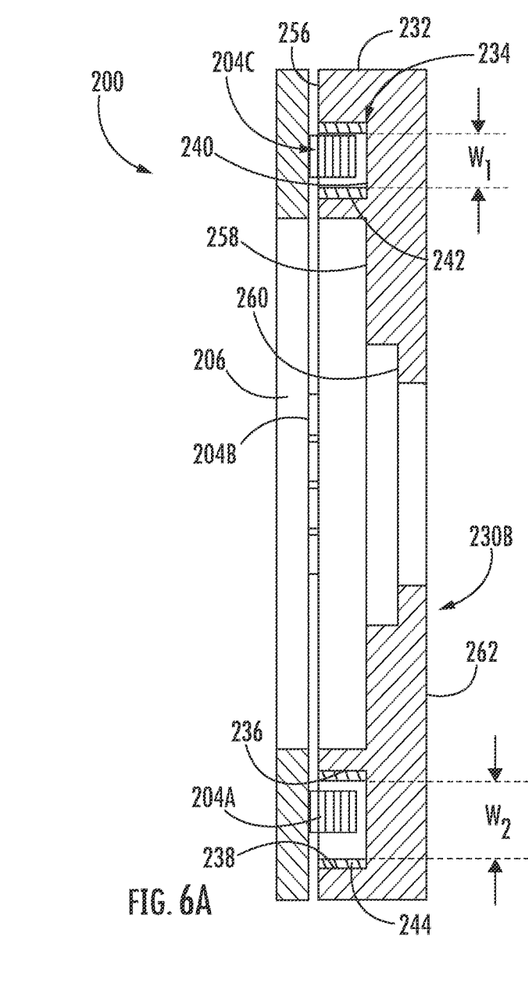
FIG. 6A shows a cross-sectional view of a schematic of a resolver assembly according to an embodiment of the present disclosure.
Figure 6B:
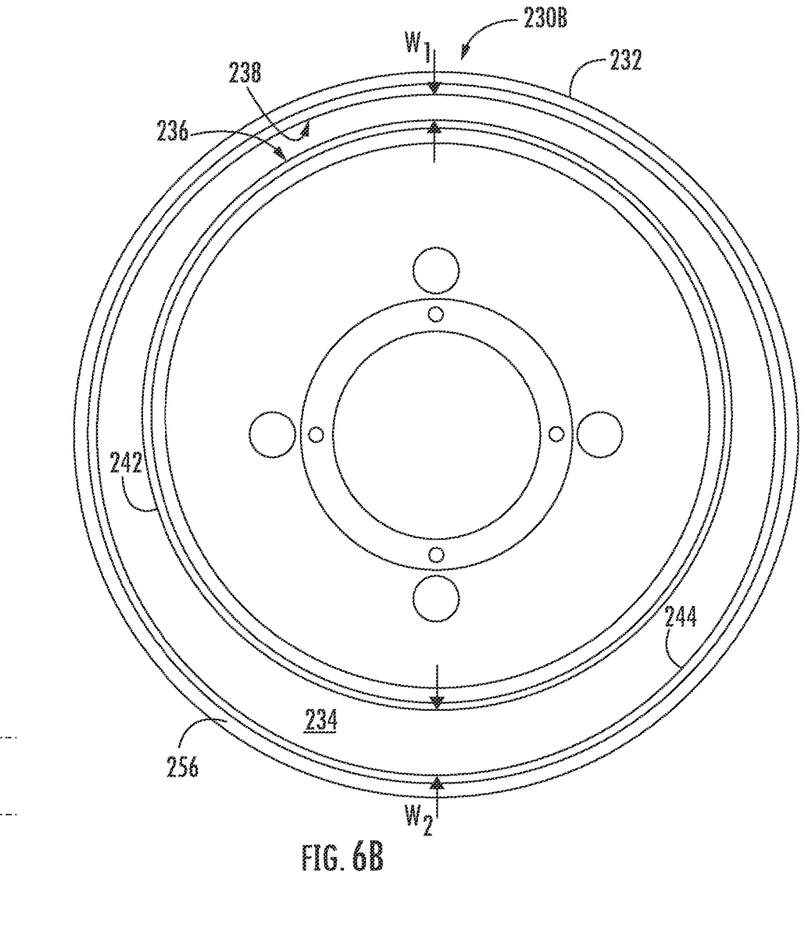
FIG. 6B shows a top plan view of the rotor assembly according to FIG. 6A.

As illustrated in FIGS. 6A and 6B, in another embodiment, a rotor assembly 230B includes a rotor body 232 made of a non-magnetic material. The radially-inner diametric surface 236 and the radially-outer diametric surface 238 of the annular recess 234 are covered with a magnetic material 242, 244. The magnetic material 242 coupled with the radially-inner diametric surface 236 forms a first thin-walled cylinder having a first diameter slightly smaller than the diameter of the radially-inner diametric surface 236. The magnetic material 244 coupled with the radially-outer diametric surface 238 forms a second thin-walled cylinder having a second diameter slightly smaller than the diameter of the radially-outer diametric surface 238. The second diameter is greater than the first diameter.

Figures 7A, 7B:
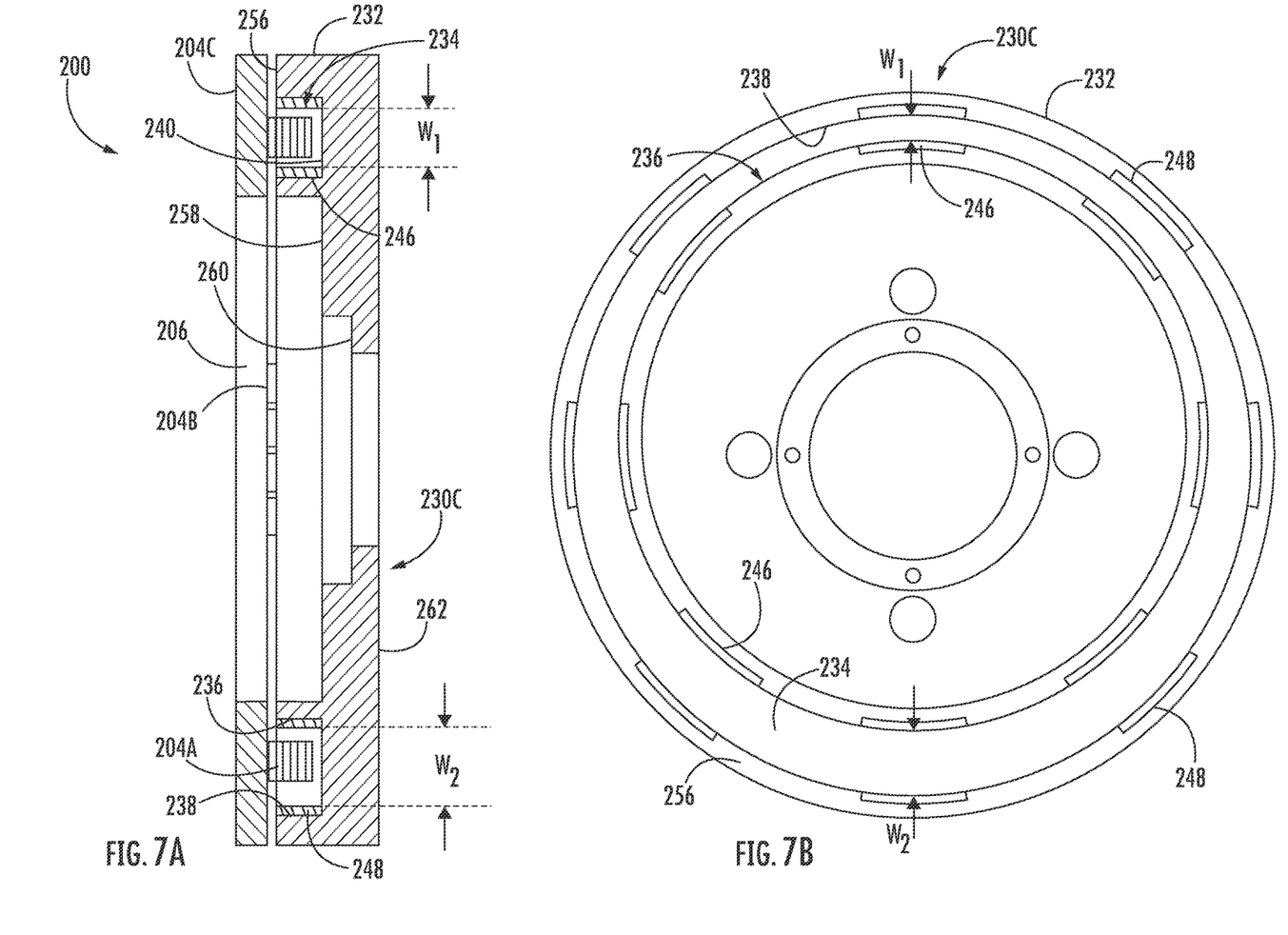
FIG. 7A shows a cross-sectional view of a schematic of a resolver assembly according to an embodiment of the present disclosure.
FIG. 7B shows a top plan view of the rotor assembly according to FIG. 7A.

As illustrated in FIGS. 7A and 7B, in yet another embodiment, a rotor assembly 230C includes a rotor body 232 having a body made of a non-magnetic material. A plurality of magnetic sections 246 are coupled with the radially-inner diametric surface 236 and a plurality of magnetic sections 248 are coupled with the radially-outer diametric surface 238 of the annular recess 234. Rather than a continuous cylinder of magnetic material, the magnetic sections 246, 248 are uniformly located about the circumferences of the radially-inner diametric surface 236 and the radially-outer diametric surface 238, respectively. Utilizing magnetic sections 246, 248 provides the equivalent of a multi-speed resolver having multiple electrical cycles for each mechanical cycle of rotation of the rotor assembly 230.

During installation, the rotor assembly annular recess 234 is installed over the inductors 204 such that both the stator assembly 202 and the rotor assembly 230 have a common center line x (see FIG. 5). After installation the inductors 204 extend into the annular recess 234 of the rotor body 232. A clearance between the stator assembly 202 and the rotor assembly 230 is maintained, and the rotor assembly 230 can rotate with respect to the stator assembly 202. As the rotor assembly 230 rotates, the gap between the walls of the annular recess 234 and each inductor group 204A, 204B, 204C, 204D varies. The variation in the gap between the walls of the annular recess 234 and the inductor groups 204A, 204B, 204C, 204D changes the reluctance of the magnetic circuit. The magnetic circuit includes at least the inductor groups 204A, 204B, 204C, 204D and the rotor 230. The varying reluctance of the magnetic circuit causes variation in the magnitude of the magnetic flux in each inductor group 204A, 204B, 204C, 204D, and this variation in magnetic flux produces a variation in the voltage developed in the inductor output coils 220B. The reluctance of the magnetic circuit is operable to change as a function of the angular position of the rotor 230.

The number of turns of the input coil 220A and output coil 220B on each inductor 204, the number of inductors 204, and the pattern of installation of the inductor groups 204A, 204B, 204C, 204D on the PCB 206 can be varied to provide an output signal with the desired electrical parameters.

The variable reluctance resolver 200 may be electrically connected with an oscillator operable to supply alternating current to the inductor input coils 220A. The variable reluctance resolver 200 may also be electrically connected with one or more resolver-to-digital convertors to convert the sine and cosine outputs of the variable reluctance resolver into a digital format. Because the variable reluctance resolver stator assembly 202 includes the PCB 206, the variable reluctance resolver 200 is easily incorporated into existing electronic components and systems such as, but not limited to, a customer provided oscillator and resolver-to-digital convertor. The variable reluctance resolver 200 has the advantage of being relatively easily retrofitted into existing systems and integrated with existing power electronics.

Figure 8:
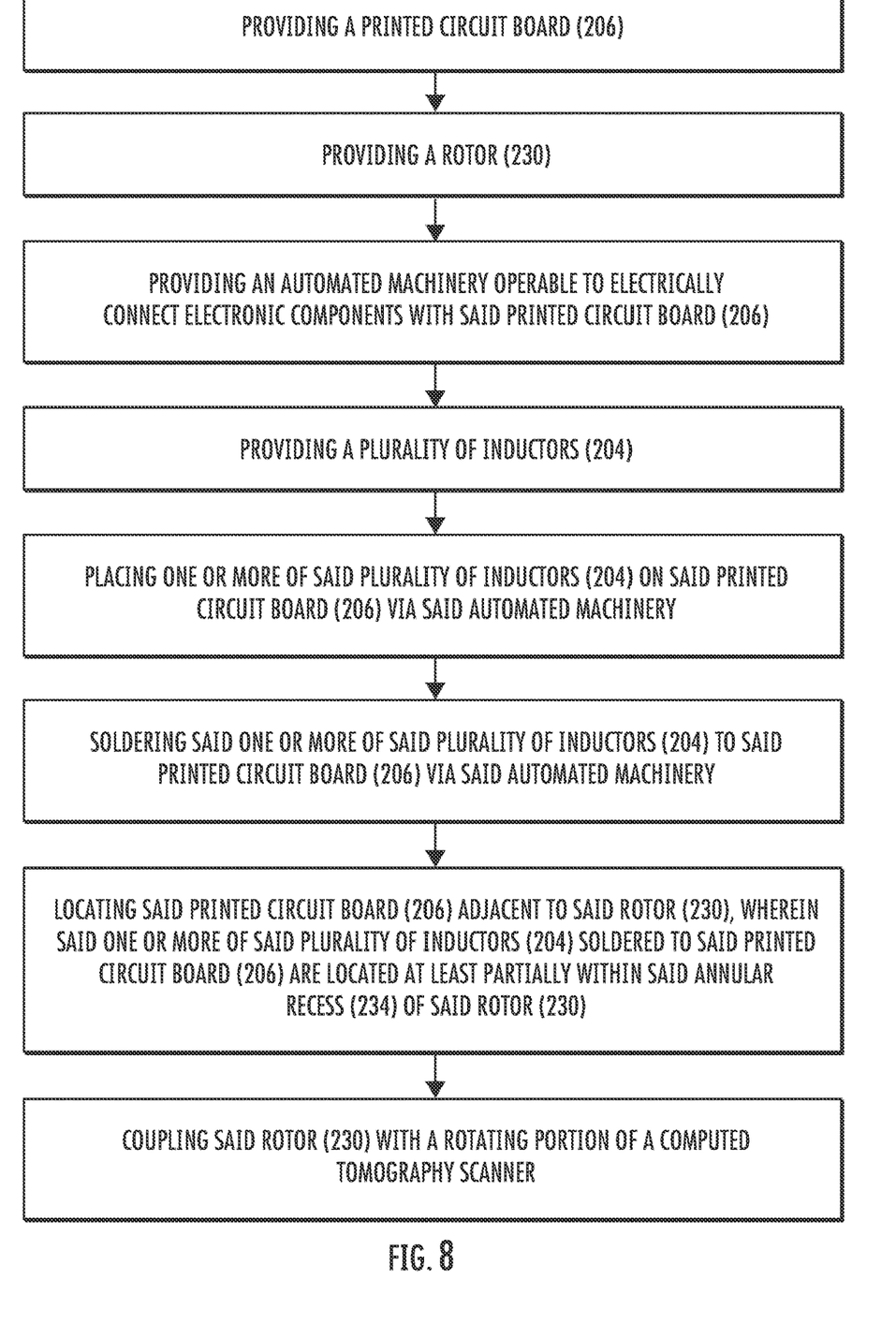
FIG. 8 shows a flow chart of a method of manufacturing a variable reluctance resolver according to an embodiment of the present disclosure.

As illustrated in FIG. 8, in an embodiment, a method of manufacturing the variable reluctance resolver 200 includes creating the stator 202 utilizing automated machinery operable to electrically connect (e.g., solder) electronic components, such as the inductors 204, with the printed circuit board 206. The method also includes producing the rotor 230 having a body with a first surface and a second surface, and an annular recess 234 located in the rotor first surface. The annular recess 234 having a radially inner surface 236 and a radially outer surface 238 defining a width $w_1$, $w_2$ variable with an angular position about the rotor 230. The method further includes placing the plurality of inductors 204 on the printed circuit board 206 via the automated machinery, soldering the plurality of inductors 204 to the printed circuit board 206 via the automated machinery, and locating the printed circuit board 206 adjacent to the rotor 230, wherein the plurality of inductors 204 soldered to the printed circuit board 206 are located at least partially within the annular recess 234.

Conventional resolver designs utilizing a rotor assembly having two lobes, as illustrated in FIG. 1, create two electrical cycles per mechanical rotation of the rotor assembly. In this conventional design there are two points in a mechanical rotation that will provide the same angular indication. In other words, the conventional design is identical at points 180 degrees apart. In contrast, the variable reluctance resolver 200 allows for a single cycle of electrical output per mechanical rotation, thereby eliminating any ambiguity of angular position. The variance in the width w of the annular recess 234 in the rotor 230 enables the single cycle of electrical output per mechanical rotation. For example, at a first point in rotation of the rotor 230 the variable reluctance resolver 200 produces a maximum output voltage and at a second point 180 degrees apart from the first point in rotation of the rotor 230 the variable reluctance resolver 200 produces a minimum output voltage.

Additionally, the variable reluctance resolver 200 enables the same inductors 204 and installation pattern to be utilized for variable reluctance resolvers of different sizes. In contrast, conventional resolvers require a custom design for different size systems because the magnetic circuit of conventional resolvers changes with size.

For example, the variable reluctance resolver 200 may be utilized with a computed tomography (CT) scanner. The variable reluctance resolver 200 may also be utilized in military and aerospace applications. For example, the variable reluctance resolver 200 may be utilized in, but is not limited to, radar antenna positioning systems, motor commutation, electro-optical systems, forward-looking-infra-red (FLIR) systems, and target acquisition systems.

One or more features of the embodiments described herein may be combined to create additional embodiments which are not depicted. While various embodiments have been described in detail above, it should be understood that they have been presented by way of example, and not limitation. It will be apparent to persons skilled in the relevant arts that the disclosed subject matter may be embodied in other specific forms, variations, and modifications without departing from the scope, spirit, or essential characteristics thereof. The embodiments described above are therefore to be considered in all respects as illustrative, and not restrictive. The scope of the invention is indicated by the appended claims, and all changes that come within the meaning and range of equivalents thereof are intended to be embraced therein.

What is claimed is:
1. A variable reluctance resolver, comprising:
  a stator assembly including
    a printed circuit board having a first surface and a second surface; and
    a plurality of inductors coupled with said printed circuit board first surface;
    wherein said plurality of inductors are in electrical connection with a power source; and
  a rotor including
    a body having a first surface and a second surface; and
    an annular recess located in said rotor first surface;
    said annular recess comprising a radially inner surface and a radially outer surface;
    wherein said annular recess defines a width variable with an angular position;
    wherein said plurality of inductors are located at least partially within said annular recess and said rotor is operable to rotate relative to said stator assembly.

2. The variable reluctance resolver according to claim 1, wherein said rotor comprises a magnetic material operable to create a magnetic circuit including said inductors and said rotor.

3. The variable reluctance resolver according to claim 2, wherein said variable width of said annular recess provides a variable gap between at least one of said radially inner and outer surfaces of said annular recess and said inductors, whereby a reluctance of said magnetic circuit is operable to change as a function of said angular position of said rotor.

4. The variable reluctance resolver according to claim 1, wherein said plurality of inductors comprise:
   a first group of inductors operable to provide a positive cosine output signal;
   a second group of inductors operable to provide a positive sine output signal;
   a third group of inductors operable to provide a negative cosine output signal; and
   a fourth group of inductors operable to provide a negative sine output signal.

5. The variable reluctance resolver according to claim 4, wherein said first, second, third, and fourth groups of inductors each include four inductors.

6. The variable reluctance resolver according to claim 1, wherein said rotor body comprises a non-magnetic material, a first magnetic material is coupled with said radially inner surface of said annular recess, and a second magnetic material is coupled with said radially outer surface of said annular recess.

7. The variable reluctance resolver according to claim 6, wherein said first and second magnetic materials are operable to create a magnetic circuit with said inductors.

8. The variable reluctance resolver according to claim 1, wherein said rotor body comprises a non-magnetic material, a first plurality of magnetic sections are coupled with said radially inner surface of said annular recess, and a second plurality of magnetic sections are coupled with said radially outer surface of said annular recess.

9. The variable reluctance resolver according to claim 8, wherein each mechanical cycle of rotation of said rotor provides multiple electrical cycles.

10. The variable reluctance resolver according to claim 1, wherein said printed circuit board comprises:
    a peripheral edge defining a circle; and
    a hole located through said first and second surfaces coaxial with said peripheral edge.

11. The variable reluctance resolver according to claim 10, wherein said plurality of inductors are located about a circumference concentric with said printed circuit board peripheral edge.

12. The variable reluctance resolver according to claim 1, wherein said plurality of inductors comprise:
    a ferromagnetic core;
    a first coil wrapped around said ferromagnetic core; and
    a second coil wrapped around said ferromagnetic core, wherein said second coil is located about said first coil.

13. A method of manufacturing a variable reluctance resolver, the method comprising:
    providing a printed circuit board;
    providing a rotor including:
      a body having a first surface and a second surface; and
      an annular recess located in said rotor first surface, said annular recess comprising a radially inner surface and a radially outer surface;
      wherein said annular recess defines a width variable with an angular position;
    providing an automated machinery operable to electrically connect electronic components with said printed circuit board;
    providing a plurality of inductors;
    placing one or more of said plurality of inductors on said printed circuit board via said automated machinery;
    soldering said one or more of said plurality of inductors to said printed circuit board via said automated machinery; and
    locating said printed circuit board adjacent to said rotor, wherein said one or more of said plurality of inductors soldered to said printed circuit board are located at least partially within said annular recess.

14. The method of manufacturing a variable reluctance resolver according to claim 13, the method comprising coupling said rotor with a rotating portion of a radar antenna positioning system.

15. The method of manufacturing a variable reluctance resolver according to claim 13, wherein said plurality of inductors are provided on a reeled tape.

* * * * *